US009356627B2

(12) United States Patent
Tian

(10) Patent No.: US 9,356,627 B2
(45) Date of Patent: *May 31, 2016

(54) METHOD AND APPARATUS FOR IMPROVING TRANSMISSION OF DATA ON A BANDWIDTH MISMATCHED CHANNEL

(71) Applicant: AT&T Intellectual Property I, L.P., Atlanta, GA (US)

(72) Inventor: Chao Tian, Madison, NJ (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/307,199

(22) Filed: Jun. 17, 2014

(65) Prior Publication Data

US 2014/0298145 A1 Oct. 2, 2014

Related U.S. Application Data

(63) Continuation of application No. 13/286,474, filed on Nov. 1, 2011, now Pat. No. 8,774,308.

(51) Int. Cl.
*H04L 27/00* (2006.01)
*H03M 13/35* (2006.01)
*H04L 1/00* (2006.01)
*G10L 19/02* (2013.01)

(52) U.S. Cl.
CPC ........... *H03M 13/353* (2013.01); *H04L 1/0014* (2013.01); *H04L 1/0041* (2013.01); *G10L 19/0204* (2013.01); *H04L 2001/0098* (2013.01)

(58) Field of Classification Search
CPC ......... H04L 27/362; H04L 5/00; H04L 15/00; H04L 17/00; H04B 1/00; H04B 3/00; H04B 5/00; H04B 7/00; H04B 10/00; H04B 13/00; H04B 14/00
USPC .................................... 375/295, 240.11, 262
See application file for complete search history.

(56) References Cited

U.S. PATENT DOCUMENTS

| | | | |
|---|---|---|---|
| 5,586,024 A | 12/1996 | Shaibani | |
| 5,588,024 A | 12/1996 | Takano | |
| 5,625,743 A | 4/1997 | Fiocca | |
| 6,021,385 A | 2/2000 | Jarvinen et al. | |
| 6,104,996 A | 8/2000 | Yin | |
| 6,349,284 B1 | 2/2002 | Park et al. | |
| 6,362,760 B2 | 3/2002 | Kober et al. | |
| 6,487,535 B1 * | 11/2002 | Smyth et al. | 704/500 |
| 6,604,069 B1 | 8/2003 | Tsutsui | |
| 6,725,192 B1 | 4/2004 | Araki | |
| 6,950,794 B1 | 9/2005 | Subramaniam et al. | |
| 7,047,187 B2 | 5/2006 | Cheng et al. | |
| 7,409,350 B2 | 8/2008 | Hsu | |
| 8,774,308 B2 * | 7/2014 | Tian | 375/295 |
| 8,781,023 B2 * | 7/2014 | Tian | 375/295 |
| 8,798,184 B2 * | 8/2014 | Su | H04B 7/0617 375/260 |
| 9,210,002 B2 * | 12/2015 | Oh | H04L 25/0224 |

(Continued)

*Primary Examiner* — Emmanuel Bayard

(57) ABSTRACT

A method and apparatus for providing transmission on a channel in a network are disclosed. For example, the method receives a plurality of source samples, divides the plurality of source samples into a plurality of subbands in accordance with a ratio of the plurality of source samples to a number of channel uses of the channel, wherein each subband comprises a first number of source samples, determines a channel input from the plurality of source samples in accordance with a hybrid coding scheme, and transmits the channel input over the network.

20 Claims, 4 Drawing Sheets

(56) References Cited

U.S. PATENT DOCUMENTS

| | | |
|---|---|---|
| 2004/0064310 A1 | 4/2004 | Banba et al. |
| 2004/0081075 A1 | 4/2004 | Tsukakoshi |
| 2004/0125878 A1 | 7/2004 | Liljeryd et al. |
| 2005/0043830 A1 | 2/2005 | Lee et al. |
| 2005/0065792 A1 | 3/2005 | Gao |
| 2005/0207505 A1 | 9/2005 | Lakkis |
| 2005/0271367 A1 | 12/2005 | Lee et al. |
| 2006/0018365 A1 | 1/2006 | Jung et al. |
| 2006/0147124 A1 | 7/2006 | Edler et al. |
| 2007/0244699 A1 | 10/2007 | Mogi et al. |
| 2009/0132238 A1 | 5/2009 | Sudhakar |
| 2010/0223311 A1 | 9/2010 | Sugiyama |
| 2011/0280232 A1 | 11/2011 | Wu et al. |
| 2011/0280332 A1 | 11/2011 | Yonge, III |
| 2012/0008559 A1 | 1/2012 | Leung |
| 2012/0063354 A1 | 3/2012 | Vanga et al. |
| 2012/0063554 A1 | 3/2012 | Smith |
| 2012/0088559 A1 | 4/2012 | McSweyn et al. |
| 2013/0107979 A1 | 5/2013 | Tian |
| 2013/0107986 A1 | 5/2013 | Tian |
| 2014/0156287 A1* | 6/2014 | Koishida et al. .............. 704/500 |
| 2014/0328432 A1* | 11/2014 | Tian .............................. 375/296 |

* cited by examiner

METHOD AND APPARATUS FOR IMPROVING TRANSMISSION OF DATA ON A BANDWIDTH MISMATCHED CHANNEL

This application is a continuation of U.S. patent application Ser. No. 13/286,474, filed Nov. 1, 2011, now U.S. Pat. No. 8,774,308, and is herein incorporated by reference in its entirety.

The present disclosure relates generally to data transmission on a communication network and, more particularly, to a method and apparatus for improving data transmission on a bandwidth mismatched channel in a network, e.g., a wireless network.

BACKGROUND

Digital coding schemes based on source-channel separation principle are sensitive to channel condition. If the channel condition is worse than what a code is designed for, the decoder fails to completely decode a code that has traversed the channel. On the other hand, if the channel condition is better than what the code is designed for, the code fails to provide any performance improvement. Thus, the digital coding scheme suffers from a threshold effect.

One approach is to design the coding scheme to achieve an optimal performance for a given channel condition. However, the resulting code offers performance improvement either when the channel condition is worse or when the channel condition is better, but not both.

SUMMARY

In one embodiment, the present disclosure provides a method and an apparatus for providing transmission on a channel in a network, e.g., a wireless network. For example, the method receives a plurality of source samples, divides the plurality of source samples into a plurality of subbands in accordance with a ratio of the plurality of source samples to a number of channel uses of the channel, wherein each subband comprises a first number of source samples, determines a channel input from the plurality of source samples in accordance with a hybrid coding scheme, and transmits the channel input over the network.

BRIEF DESCRIPTION OF THE DRAWINGS

The teaching of the present disclosure can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present disclosure broadly describes a method and apparatus for improving the transmission of data on a bandwidth mismatched channel in a network, e.g., a wireless network. Although the teachings of the present disclosure are discussed below in the context of wireless networks, the teaching is not so limited. Namely, the teachings of the present disclosure can be applied for other types of wireless networks, etc.

Digital communication systems have been widely deployed in modern communication networks. However, these digital communications systems are based on Shannon's source-channel separation principle. Digital coding schemes based on source-channel separation principle are sensitive to channel conditions. For example, a code may be designed for a specific channel condition. However, if the channel condition is worse than what the code is designed for, the decoder may fail to completely decode a code that has traversed the channel. In another scenario, if the channel condition is better than what the code is designed for, the code may fail to provide any performance improvement. Thus, the digital coding scheme based on source-channel separation principle suffers from a threshold effect.

In one embodiment, the present disclosure provides a hybrid analog and digital coding scheme that is capable of improving decoding performance when the channel condition is worse and when the channel condition is better, simultaneously. The hybrid analog and digital coding scheme is also referred to as a hybrid coding scheme. Namely, the coding scheme of the present disclosure is able to achieve a performance improvement for both the better and the worse channel conditions, while keeping the performance optimal for a given target channel condition.

Figure 1:
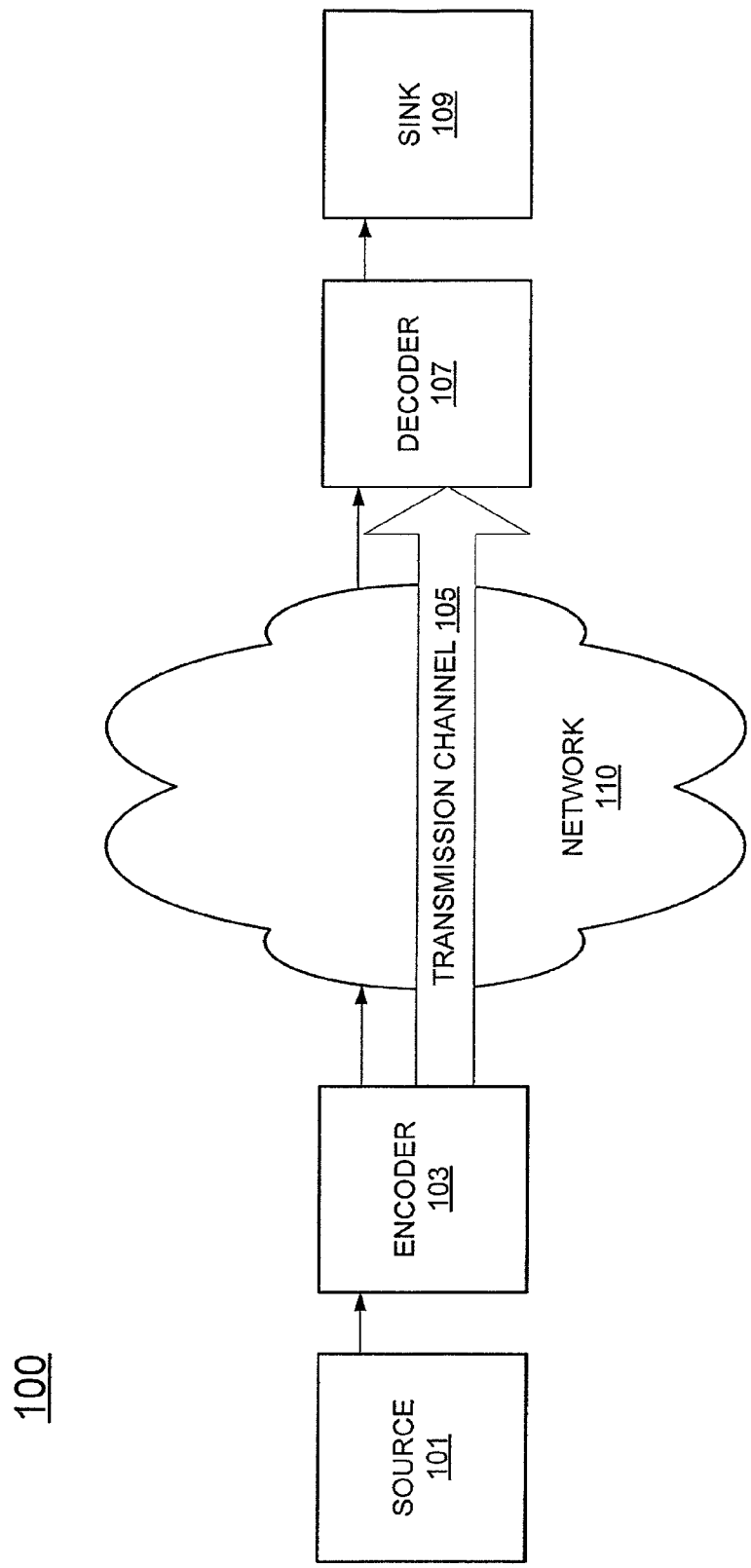
FIG. 1 illustrates an exemplary transmission system related to the present disclosure.

FIG. 1 illustrates an exemplary transmission system 100 related to the present disclosure. The transmission system 100 comprises a source 101 (broadly a data source), an encoder 103, a transmission channel 105, a decoder 107, and a sink 109 (broadly a data destination). The transmission channel 105 traversed the network 110. The network 110 may be a wireless network. It should be noted that each of the modules discussed above in the transmission system 100 may be implemented in one or more hardware devices, e.g., one or more hardware computing devices having one or more processors and the like.

In one embodiment, the source 101 transmits samples (e.g., broadly data samples) to the encoder 103. The encoder 103 performs the coding, i.e., applying a coding to the received samples. The resulting (encoded) output of the encoder is then transmitted to the decoder 107 via the transmission channel 105. The decoder 107 performs reconstruction of the source samples and forwards the decoded samples to the sink 109. It should be noted that the transmission system 100 may comprise many other network elements (not shown), e.g., transmitters, receivers, base stations, routers, switches, gateways, and the like.

The problem of providing transmission of data on a bandwidth mismatched channel may be formulated as a lossy source broadcast problem with two users. In one embodiment, the source and the additive noise of the channel are both Gaussian. The measure used to evaluate the performance of a code is the reconstruction mean squared error. In order to more clearly illustrate the problem, the source and channel conditions are mathematically defined as follows:

First, the source is a memoryless zero-mean Gaussian source with unit variance $S \sim N(0,1)$. Similarly, the channel is a memoryless channel given by: $Y=X+N$, wherein $X$ is the channel input subject to an average power constraint P, and $N \sim N(0,N)$ is a memoryless additive Gaussian noise. Then, the transmission signal to noise ratio (P/N) is denoted by SNR.

In order to clearly illustrate the teachings of the current disclosure, the concept of channel use is introduced. Channel use refers to a channel's ability to transmit a sample. For example, if there are ten source samples generated per second and there are thirty channel uses per second, then there are three channel uses available for transmitting each source sample. If one channel use is available per source sample, the source bandwidth and the channel bandwidth are said to be matched. If the source bandwidth and the channel bandwidth are matched, a linear scaling of the source sample provides an optimal performance.

However, when the source bandwidth and the channel bandwidth are not matched, there are no known methods that provide a complete characterization for both worse and better channel conditions, simultaneously. The present disclosure provides a hybrid coding scheme for transmitting on a bandwidth mismatched channel that provides performance improvement for both worse and better channel conditions.

First consider two other receivers—a receiver with a worse channel condition and another receiver with a better channel condition. The receiver with a worse channel condition has a transmission signal to noise ratio of $SNR^+$ and the receiver with a better channel condition has a transmission signal to noise ratio of $SNR^-$. Hence, $SNR^+ \geq SNR$ and $SNR^- \leq SNR$. The channel output for the channel with the worse channel condition is denoted by $Y^+$. The channel output for the channel with the better channel condition is denoted by $Y^-$.

For example, if there are three users and the users are designated as a good user, a median user and a bad user, the respective transmission signal to noise ratios for the three users may be designated by $SNR^+$, $SNR$, and $SNR^-$, respectively.

The bandwidth of the source (source bandwidth) and the bandwidth of the channel (channel bandwidth) may not be matched. For example, for each m source samples, a total of n channel uses may be available. The ratio of the number of channel uses to the number of source samples is referred to as a bandwidth expansion factor. The bandwidth expansion factor is defined as:

$$b \triangleq \frac{n}{m}.$$

If b<1, the bandwidth is said to be compressed. If b>1, the bandwidth is said to be expanded. If b=1, the bandwidth is said to be matched.

Using Shannon's source channel separation theorem, while ignoring all other receivers, the optimal distortion for a receiver with transmission signal to noise ratio of SNR is given by:

$$D^*(SNR) = D\left(\frac{n}{m}C\right) = D(bC),$$

wherein D(R) is a Gaussian distortion rate function and C is a Gaussian channel capacity per channel use. The Gaussian channel capacity per channel use may also be referred to as simply as a Gaussian channel capacity.

Then, substituting for the Gaussian distortion-rate function and the Gaussian channel capacity, the optimal distortion (described above) may be determined as follows: $D^*(SNR)=\exp(-b \log(1+SNR))=(1+SNR)^{-b}$, wherein the natural logarithm function (log) is used.

For the case in which the bandwidth is expanded (i.e. b>1), a method described by Reznic, Feder and Zamir may achieve an improved distortion behavior for either a receiver with worse channel condition or better channel condition—but not both.

For example, for the channel conditions $SNR^-$, $SNR$ and $SNR^+$, respectively, Reznic, Feder and Zamir may achieve either a distortion triple $(D^\dagger(SNR^-), D^*(SNR), D^*(SNR))$ or a distortion triple $(D'(SNR^-), D^*(SNR), D^\dagger(SNR^+))$, wherein $$D^\dagger(SNR^+) = \frac{1}{(1+SNR)^{b-1}(1+SNR^+)},$$

$$D^\dagger(SNR^-) = \frac{1}{(1+SNR^-)}, \text{ and}$$

$$D'(SNR^-) = 1 - \frac{SNR^-}{(1+SNR)^{b-1}(1+SNR^-)}.$$

However, the Reznic, Feder and Zamir method does not achieve improved distortion behavior for both worse and better channel conditions, simultaneously. Note that $D^\dagger$ has greater performance gain over $D^*$ as compared to the performance gain of $D'$ over the $D^*$. In order to achieve the $D^\dagger(SNR^-)$ for the bad user, Reznic, Feder and Zamir cannot provide any performance gain for the good user over the performance of the median user. Similarly, in order to achieve $D^\dagger(SNR^+)$ for the good user, Reznic, Feder and Zamir can only achieve minimal distortion reduction for the bad user over the median user.

For the case in which the bandwidth is compressed (i.e. b<1), a method described by Prabhakaran may be used to achieve an improved distortion behavior for either a receiver with worse channel condition or a receiver with a better channel condition—but not both.

For example, for the channel conditions $SNR^-$, $SNR$ and $SNR^+$, respectively, Prabhakaran may achieve either a distortion triple $(D^\dagger(SNR^-), D^*(SNR), D^*(SNR))$ or a distortion triple $(D'(SNR^-), D^*(SNR), D^\dagger(SNR^+))$, wherein, $$D^\dagger(SNR^+) = (1-b)D^*(SNR) + b\frac{SNR}{(1+SNR)^b SNR^+ + SNR - SNR^+},$$

$$D^\dagger(SNR^-) = 1 - bSNR^- \frac{1 + SNR - (1+SNR)^{1-b}}{SNR(1+SNR^-)}, \text{ and}$$

$$D'(SNR^-) = 1 - bSNR^- \frac{(1+SNR)^b - 1}{SNR(1+SNR^-)},$$

but not both.

In both the Reznic, Feder and Zamir and the Prabhakaran approaches (described above), $D'(SNR^-) \geq D^\dagger(SNR^-)$. A coding scheme used for the above bandwidth expansion and bandwidth compression examples is a coding scheme designed for sending a Gaussian source on a Gaussian channel, wherein the bandwidth is matched (i.e. b=1), and a side information is available at the receiver but not at the transmitter. The coding scheme is referred to as a hybrid joint source channel Wyner-Ziv coding scheme. In order to use the hybrid joint source channel Wyner-Ziv coding scheme, first let $S_d$ represent the side information, Z represent a Gaussian random variable independent of $S_d$, and S represent the source. Then, $S=S_d+Z$. The coding scheme then operates as follows:

First, a set of codewords may be generated by an encoder according to a distribution $U=X+\kappa S$, wherein X is a Gaussian random variable independent of the source S. The objective of the encoder is to find a codeword $u^m$ such that the codeword is jointly typical with a source sequence $S^m$. The encoder then transmits $u^m - \kappa S^m$ on the channel. A decoder receives a channel output $Y^m$. A side information $S_d^m$ is available at the receiver. The decoder uses $Y^m$, $S_d^m$ and joint typicality for decoding. When the rate of the codebook is chosen such that $I(U;S_d,Y) > R > I(U;S)$, then the codeword is correctly decoded. The source estimate is formed using $S_d$, U, Y jointly. In order to achieve an optimal performance for the channel condition of SNR, an appropriate value is chosen for $\kappa$.

It is important to note that other coding schemes may be used. For example, an encoder may use a distribution $U = X + \alpha T + \kappa S$, wherein T is a channel state. The encoder may then transmit the resulting X vector, $u^m - \alpha T^m - \kappa S^m$, on the channel. If the rate of the generated U codebook is chosen such that $I(U;Y) > R > I(U;T,S)$, the codeword is correctly decoded and the source estimate is formed by using Y, U jointly.

The present disclosure provides a hybrid coding scheme that achieves the distortion triple $(D^\dagger(SNR^-), D^*(SNR), D^\dagger(SNR^+))$ for the channel conditions $SNR^-$, SNR and $SNR^+$, respectively, wherein the bandwidth of the channel is compressed.

For example, the bandwidth expansion factor, $$b \triangleq \frac{n}{m},$$

for the channel is such that $b<1$. Since the channel is compressed when $b<1$, for convenience, another factor is herein defined as the inverse of the bandwidth expansion factor. The new factor is denoted by a. Then, $$a = b^{-1} = \frac{m}{n}.$$

In one embodiment, the new factor (the inverse of the bandwidth expansion factor for the channel) has an integer value.

In one embodiment, the coding scheme of the present disclosure is based on a subband quantization. When the value of a is an integer greater than one, the method first breaks the source samples evenly into a portions, each portion having n source samples. Each of the resulting portions (having n source samples) is referred to as a subband of the source samples, or simply as a subband. For example, if there are ten source samples and two channel uses, a is then equal to five. Then, the method breaks the ten source samples into five subbands with each of the five subbands having two source samples.

In one embodiment, the method then digitally quantizes the source samples in each subband except the source samples in the last subband. For example, the source samples in each of the subbands 1, 2, . . . , a−1 are digitally quantized using a Gaussian codebook. The source samples in the last subband (subband a) are to be transmitted uncoded. Thus, the last subband is not quantized. For the example above, source samples in subbands 1-4 are digitally quantized and source samples in subband 5 are kept for transmission through a network uncoded. In one embodiment, the Gaussian codebooks used for quantizing the subbands 1, 2, . . . , a−1 are generated independently. For example, the Gaussian codebook used for quantizing source samples in a particular subband is independent of a Gaussian codebook used for quantizing source samples in any other subband.

In one embodiment, the quantizing for each subband that is quantized is performed using a quantization rate denoted by R, wherein $R = b/2 \log(1+SNR)$. Note that the quantization rate R is not applicable for the last subband, since the last subband is not quantized.

In one embodiment, the method then scales the source samples that are quantized, for each source sample that is quantized. In one embodiment, the scaling for each source sample that is quantized is performed by allocating power to each subband a power level that supports the quantization rate R.

In one embodiment, the allocating power to each subband that supports the quantization rate R is performed by allocating a power level $P_i$ for each subband i=1, 2, . . . , a−1 such that $$R = \frac{b}{2} \log\left(1 + \frac{P_i}{\sum_{j=i+1}^{a} P_j + N}\right),$$

where N is the noise described above.

The method then scales the source samples for the last subband. For example, for subband a, the source samples are scaled to match the power level of the channel.

The method then broadcasts the source samples that are quantized and scaled for subbands 1, 2, . . . , a−1, and the source samples that are scaled (without quantizing) for subband a. For example, the broadcast may be performed by superimposing codewords. For example, the codewords for each subbands 1, 2, . . . , a−1 are codewords created by quantizing and scaling the source samples for the respective subband. The codewords for subband a are created by scaling the source samples for subband a.

As described above, allocating of the power level $P_i$ for each of the subbands i=1, 2, . . . , a−1 supports the quantization rate R for each of the subbands 1, 2, . . . , a−1. Note that the quantization rate R is supported if the distortion goal is met. In order to describe the distortion the particular power allocations, the distortion triple $(D^\dagger(SNR^-), D^*(SNR), D^\dagger(SNR^+))$ for the channel conditions $SNR^-$, SNR and $SNR^+$, respectively, are then analyzed.

For a median and a good user, the allocation of the power level $P_i$ is equivalent to a power allocation for a unified coding scheme for hybrid transmission of a Gaussian source over a Gaussian channel, wherein the Gaussian channel favors the good user while simultaneously providing an optimal performance for the median user. For the good user, the method achieves the distortion $D^\dagger(SNR^+)$. For the median user, the method achieves the distortion $D^*(SNR)$.

For the bad user, the channel quality of $SNR^-$ is not sufficient for the codewords of the bad user to be decoded reliably. However, for each subband, the method of the present disclosure is able to extract information to estimate the source sample. If the source sample for each subband is estimated as $\mathbb{E}(S|Y^-)$, the distortion for each subband i=1, 2, . . . , a−1 is given by:

$$D_i = D^*(SNR) + \left[1 - \frac{P_i}{\mathrm{Var}(Y^-)}\right](1 - D^*(SNR))$$

$$= 1 - \frac{P_i}{\mathrm{Var}(Y^-)} + \frac{P_i}{\mathrm{Var}(Y^-)} D^*(SNR).$$

For the last subband (subband number a)

$$D_a = 1 - \frac{P_a}{\text{Var}(Y^-)}.$$

The overall distortion is then determined as the summation of the distortions of all the subbands. Thus, $$D(SNR^-) = \frac{1}{a}\sum_{i=1}^{a} D_i.$$

Substituting the above values for each subband yields:

$$\begin{aligned}D(SNR^-) &= 1 - b\frac{SNR^-}{1+SNR^-} + b\frac{P-P_a}{\text{Var}(Y^-)}D^*(SNR)\\&= 1 - b(SNR^-)\frac{1+SNR-(1+SNR)^{(1-b)}}{SNR(1+SNR^-)} + b\frac{P-P_a}{\text{Var}(Y^-)}D^*(SNR)\\&= D^\dagger(SNR^-).\end{aligned}$$

Thus, the distortion triple $(D^\dagger(SNR^-), D^*(SNR), D^\dagger(SNR^+))$ for the channel conditions $SNR^-$, $SNR$ and $SNR^+$, respectively, is achieved. Hence, the quantization rate R is supported by the allocation of power as described above.

Figure 2:
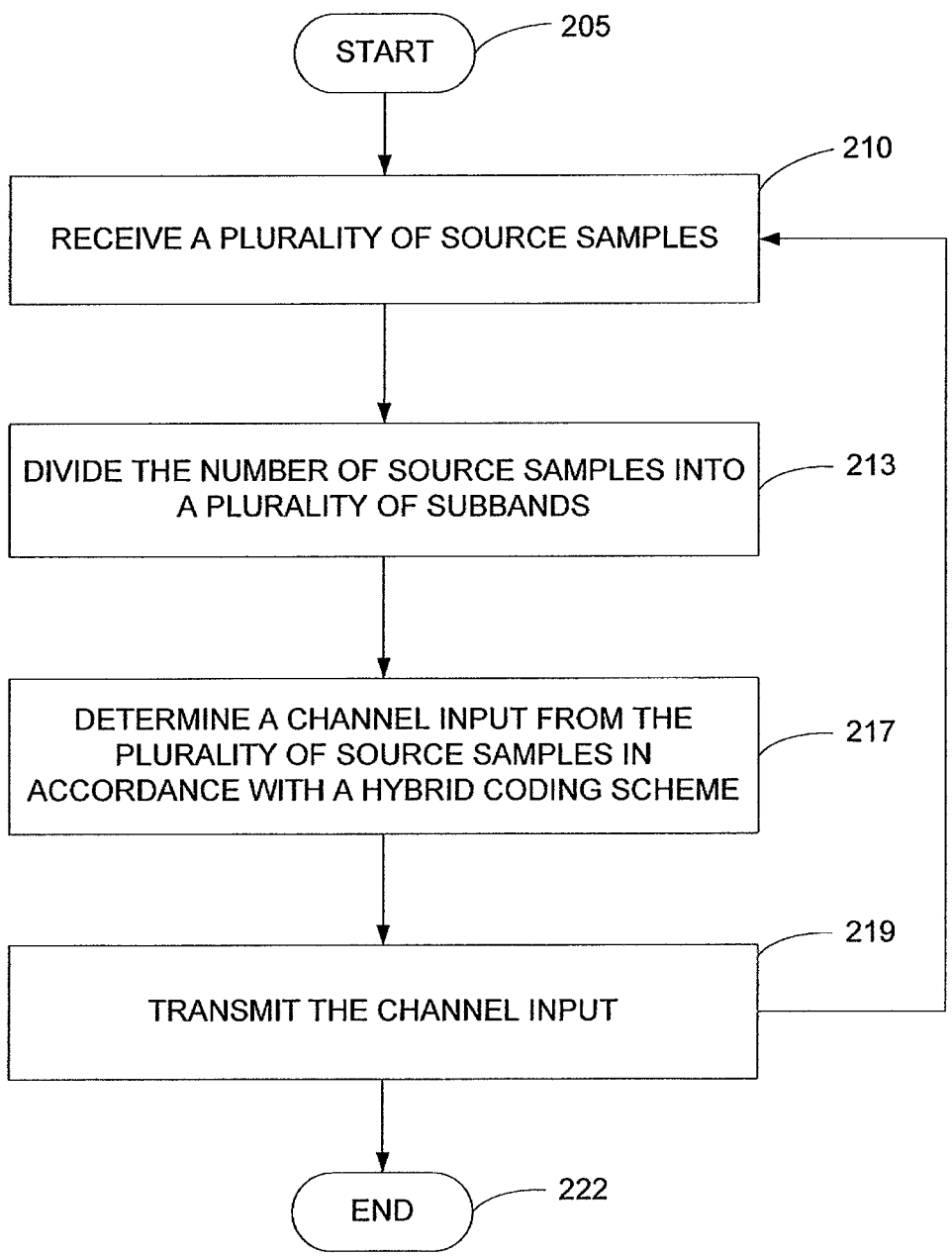
FIG. 2 illustrates a flow chart of a method for providing transmission of data on a channel in a network.

FIG. 2 illustrates a flow chart of a method 200 for providing transmission on a channel in a network, wherein a ratio of a number of source samples to a number of channel uses of the channel is an integer value, e.g., greater than one. In one embodiment, one or more steps of method 200 are implemented by an encoder used in a transmission system, e.g., a transmission system used in a wireless network. Method 200 starts in step 205 and proceeds to step 210.

In step 210, method 200 receives a plurality of source samples. For example, method 200 receives m source samples to be encoded and transmitted across the network.

In step 213, method 200 breaks or divides the plurality of source samples (or the source vector) into a plurality of subbands, wherein each subband comprises a first number of source samples. In one embodiment, the first number of source samples is equal to the number of channel uses. For example, the method breaks the number of source samples described above into a subbands, with each of the a subbands comprising n channel uses. For example, if there are ten source samples being received for encoding per second and there are two channel uses available per second, then m=10, n=2 and a=5. Then, the ten source samples received in each second are evenly divided into 5 subbands, with each subband comprising 2 source samples. The method then proceeds to determine the channel input for the channel uses.

In step 217, method 200 determines a channel input from the plurality of source samples in accordance with a hybrid coding scheme. For example, if m source samples are received and there are n channel uses, the m source samples are divided into a plurality of subbands, wherein the number of the plurality of subbands is equal to the ratio of m to n. The ratio of m to n is equal to a, as described above. Then, for each of the subbands 1, 2, ..., a-1, the method quantizes and scales the source samples that are received. For subband a, the method scales the source samples that are received. The resulting source samples are superimposed to determine the channel input for broadcasting on the channel uses of the channel. For the example above, the codewords generated from each the five subbands are superimposed to form the channel input. In one embodiment, FIG. 3 illustrates a flowchart of a method for determining of the channel input from source samples that are received in accordance with the hybrid coding scheme.

In step 219, method 200 transmits the channel input that is determined over the network. For example, the channel input is determined and transmitted towards a decoder over the network. The decoder may then reconstruct the source sample. For example, the decoder may use a linear mean square estimation technique for reconstructing the analog source sample. The method either proceeds to step 210 to continue receiving source samples or to step 222 to end the current process.

Figure 3:
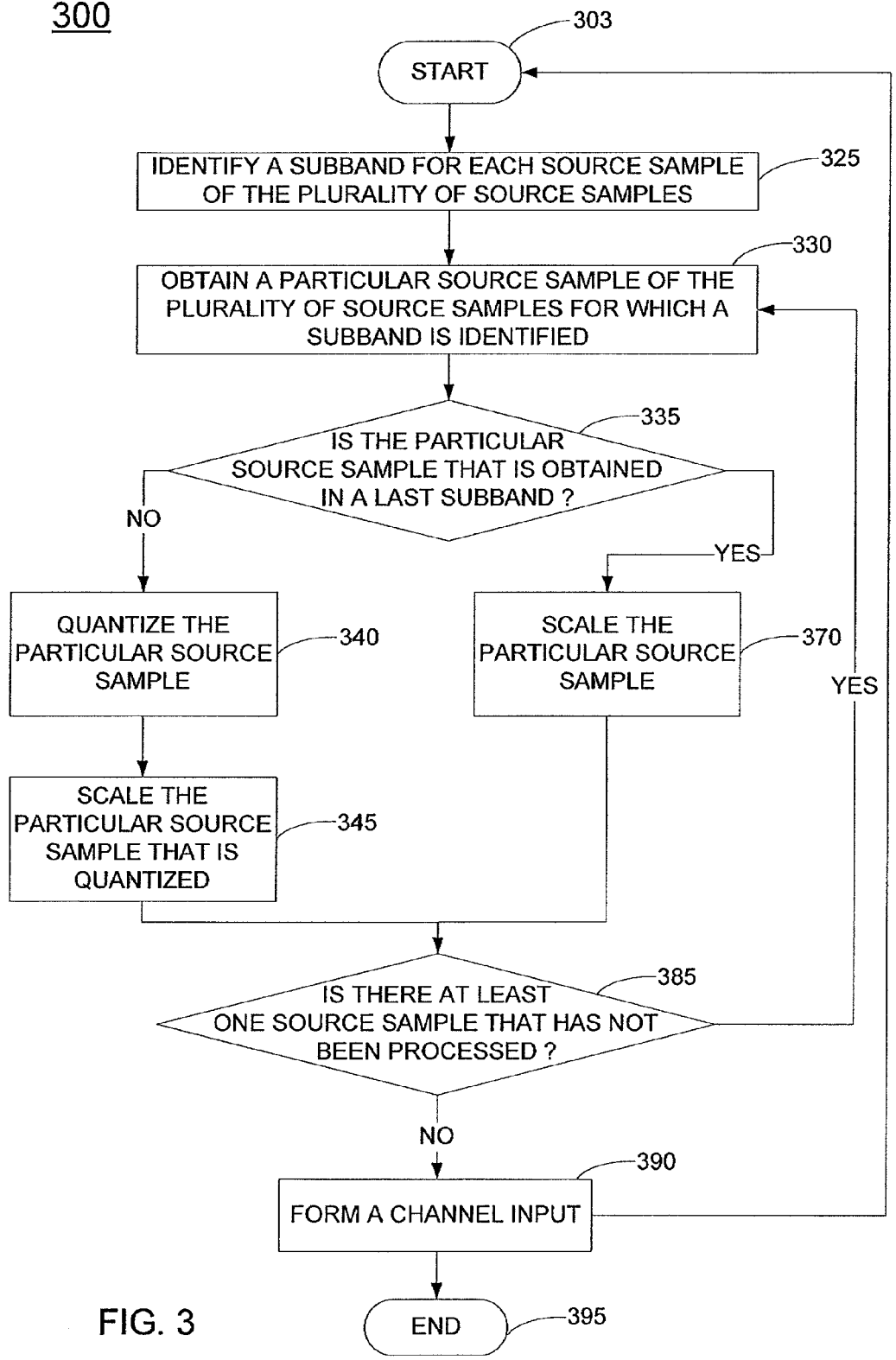
FIG. 3 illustrates a flowchart of a method for determining a channel input from source samples in accordance with a hybrid coding scheme.

FIG. 3 illustrates a flowchart of a method 300 for determining of a channel input from the plurality of source samples in accordance with the hybrid coding scheme. For example, the method 300 may be used in step 217 of FIG. 2 to determine the channel input by superimposing codewords generated from the plurality of source samples of each subband, as in a broadcast channel. Method 300 starts in step 303 and proceeds to step 325.

In step 325, method 300 identifies a subband for each source sample of the plurality of source samples. For example, if there are ten source samples received and there are five subbands, the first two source samples are placed in the first subband, the next two samples are placed in the second subband, and so on.

In step 330, method 300 obtains a particular source sample of the plurality of source samples for which a subband is identified. For example, a particular source sample is obtained such that the source sample is processed. For example, the method obtains a particular source sample of the plurality of source samples to be processed.

In step 335, method 300 determines if the particular source sample that is obtained is in a last subband. If the source sample is in the last subband, the method proceeds to step 370. Otherwise, the method proceeds to step 340. For the example above, if the particular source sample is in one of the subbands 1, 2, ..., a-1, the method proceeds to step 340. If the particular source sample is in subband a, the method proceeds to step 370.

In step 340, method 300 quantizes the particular source sample. In one embodiment, the source sample is quantized using a Gaussian codebook, or broadly a codebook. For example, the method quantizes an analog source sample to obtain a digital quantized source sample using a Gaussian codebook.

In step 345, method 300 scales the particular source sample that is quantized. In one embodiment, the scaling of the source sample that is quantized is performed by allocating power to a particular subband i that supports a quantization rate R for the particular subband i, such that the rate is $$R = \frac{b}{2}\log\left(1 + \frac{P_i}{\sum_{j=i+1}^{a} P_j + N}\right),$$

where N is a noise of a channel on which the source sample is to be transmitted. The method then proceeds to step 385.

In step 370, method 300 scales the particular source sample of the plurality of source samples such that a power level of the subband matches a power level of the channel on which the source sample is to be transmitted. For example, a received (analog) source sample is scaled without quantization. The method then proceeds to step 385.

In step 385, method 300 determines if there is at least one source sample that has not been processed. If there is at least one source sample that has not been processed, the method proceeds to step 330. Otherwise, the method proceeds to step 390.

In step 390, method 300 forms a channel input. For example, the channel input is formed by superimposing a plurality of codewords (by quantizing and scaling for subbands 1, 2, . . . , a−1, or only scaling for subband a) of the plurality of source samples. For the example above, the channel input is formed by superimposing the codewords of the five subbands, with appropriate power allocated to each subband.

In one example, for a source sample in the last subband, the processing generates a scaled version of the source sample. In another example, for a source sample that is in a particular subband other than the last subband, the processing generates a codeword from the source sample by quantizing via a Gaussian codebook (digitizing) and scaling the power allocated to the codeword in order to support the quantization rate of the particular subband. The codewords are then superimposed to form the channel input. The channel input may then be transmitted over the network, as described in step 219 of FIG. 2. The method either proceeds to step 303 to continue determining channel inputs by processing source samples or to step 395 to end the current process.

Note that in one embodiment, an encoder and a decoder are used at both locations. For example, the transmission system of FIG. 1 may be a bidirectional transmission system. In one embodiment, the encoder and decoder may be integrated in one device.

It should be noted that although not explicitly specified, one or more steps of the methods 200 or 300 described herein may include a storing, displaying and/or outputting step as required for a particular application. In other words, any data, records, fields, and/or intermediate results discussed in the method can be stored, displayed, and/or outputted to another device as required for a particular application. Furthermore, steps or blocks in FIG. 2 or FIG. 3 that recite a determining operation, or involve a decision, do not necessarily require that both branches of the determining operation be practiced. In other words, one of the branches of the determining operation can be deemed as an optional step.

Figure 4:
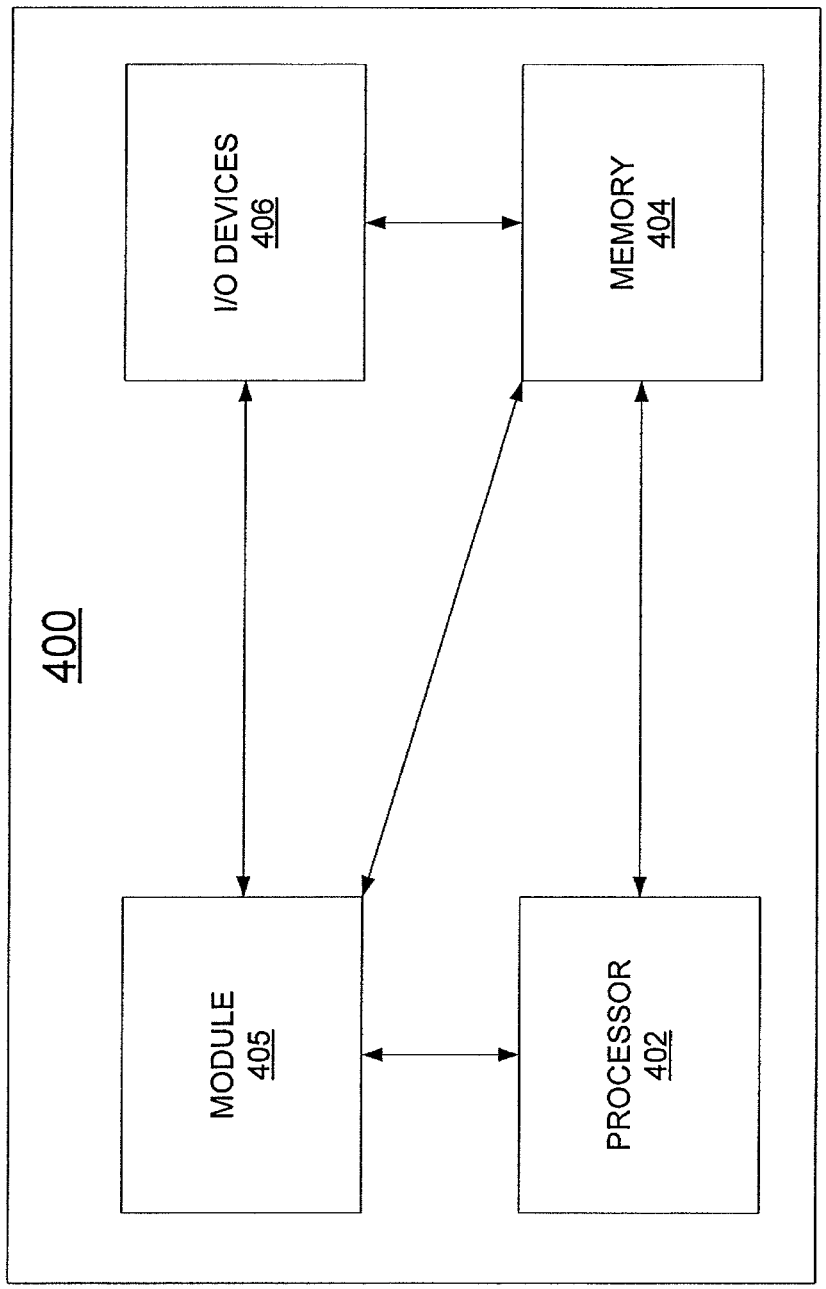
FIG. 4 illustrates a high level block diagram of a general purpose computer suitable for use in performing the functions described herein.

FIG. 4 depicts a high level block diagram of a general purpose computer suitable for use in performing the functions described herein. As depicted in FIG. 4, the system 400 comprises a hardware processor element 402 (e.g., a CPU), a memory 404, e.g., random access memory (RAM) and/or read only memory (ROM), a module 405 for providing transmission of data on a bandwidth mismatched channel, and various input/output devices 406 (e.g., storage devices, including but not limited to, a tape drive, a floppy drive, a hard disk drive or a compact disk drive, a receiver, a transmitter, a speaker, a display, a speech synthesizer, an output port, and a user input device (such as a keyboard, a keypad, a mouse, and the like)).

It should be noted that the present disclosure can be implemented in software and/or in a combination of software and hardware, e.g., using application specific integrated circuits (ASIC), a general purpose computer or any other hardware equivalents, e.g., computer readable instructions pertaining to the method(s) discussed above can be used to configure a hardware processor to perform the steps of the above disclosed method. In one embodiment, the present module or process 405 for providing transmission of data on a bandwidth mismatched channel can be loaded into memory 404 and executed by processor 402 to implement the functions as discussed above. As such, the present process 405 for providing transmission on a bandwidth mismatched channel (including associated data structures) of the present disclosure can be stored on a non-transitory (e.g., tangible and physical) computer readable storage medium, e.g., RAM memory, magnetic or optical drive or diskette and the like. For example, the processor 402 can be programmed or configured with instructions (e.g., computer readable instructions) to perform the steps of methods 200 and 300.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method for transmitting data on a channel in a network, the method comprising:
   receiving, by a processor, a plurality of source samples;
   dividing, by the processor, the plurality of source samples into a plurality of subbands in accordance with a ratio of the plurality of source samples to a number of channel uses of the channel, wherein each subband comprises a first number of source samples, wherein the number of channel uses refers to an ability of the channel to transmit the plurality of source samples;
   determining, by the processor, a channel input from the plurality of source samples in accordance with a hybrid coding scheme; and
   transmitting, by the processor, the channel input over the network to a decoder that reconstructs the plurality of source samples using the channel input for each of the plurality of subbands.

2. The method of claim 1, wherein the first number of source samples is equal to a number of channel uses.

3. The method of claim 1, wherein the determining the channel input from the plurality of source samples comprises:
   identifying a subband for a particular source sample of the plurality of source samples.

4. The method of claim 3, wherein the determining the channel input from the plurality of source samples further comprises:
   determining when the particular source sample is for a last subband of the plurality of subbands.

5. The method of claim 4, further comprising:
   scaling the particular source sample, when the particular source sample is in the last subband of the plurality of subbands.

6. The method of claim 5, wherein the scaling of the particular source sample is performed such that a power level of the last subband of the plurality of subbands matches a power level of the channel.

7. The method of claim 4, further comprising:
   quantizing the particular source sample, when the particular source sample is not in the last subband of the plurality of subbands; and
   scaling the particular source sample that is quantized.

8. The method of claim 7, wherein the quantizing is performed using a codebook.

9. The method of claim 7, wherein the scaling of the particular source sample that is quantized is performed by allocating a power level to the subband that is identified for the particular source sample, wherein the power level supports a quantization rate, wherein the quantization rate is used for quantizing the particular source sample.

10. A non-transitory computer-readable medium storing a plurality of instructions, which when executed by a processor, cause the processor to perform operations for transmitting data on a channel in a network, the operations comprising:
  receiving a plurality of source samples;
  dividing the plurality of source samples into a plurality of subbands in accordance with a ratio of the plurality of source samples to a number of channel uses of the channel, wherein each subband comprises a first number of source samples, wherein the number of channel uses refers to an ability of the channel to transmit the plurality of source samples;
  determining a channel input from the plurality of source samples in accordance with a hybrid coding scheme; and
  transmitting the channel input over the network to a decoder that reconstructs the plurality of source samples using the channel input for each of the plurality of subbands.

11. The non-transitory computer-readable medium of claim 10, wherein the first number of source samples is equal to a number of channel uses.

12. The non-transitory computer-readable medium of claim 10, wherein the determining the channel input from the plurality of source samples comprises:
  identifying a subband for a particular source sample of the plurality of source samples.

13. The non-transitory computer-readable medium of claim 12, wherein the determining the channel input from the plurality of source samples further comprises:
  determining when the particular source sample is for a last subband of the plurality of subbands.

14. The non-transitory computer-readable medium of claim 13, further comprising:
  scaling the particular source sample, when the particular source sample is in the last subband of the plurality of subbands.

15. The non-transitory computer-readable medium of claim 14, wherein the scaling of the particular source sample is performed such that a power level of the last subband of the plurality of subbands matches a power level of the channel.

16. The non-transitory computer-readable medium of claim 13, further comprising:
  quantizing the particular source sample, when the particular source sample is not in the last subband of the plurality of subbands; and
  scaling the particular source sample that is quantized.

17. The non-transitory computer-readable medium of claim 16, wherein the quantizing is performed using a codebook.

18. The non-transitory computer-readable medium of claim 16, wherein the scaling of the particular source sample that is quantized is performed by allocating a power level to the subband that is identified for the particular source sample, wherein the power level supports a quantization rate, wherein the quantization rate is used for quantizing the particular source sample.

19. An apparatus for providing transmission on a channel in a network, the apparatus comprising:
  a processor; and
  a computer-readable medium storing a plurality of instructions which, when executed by the processor, cause the processor to perform operations, the operations comprising:
    receiving a plurality of source samples;
    dividing the plurality of source samples into a plurality of subbands in accordance with a ratio of the plurality of source samples to a number of channel uses of the channel, wherein each subband comprises a first number of source samples, wherein the number of channel uses refers to an ability of the channel to transmit the plurality of source samples;
    determining a channel input from the plurality of source samples in accordance with a hybrid coding scheme; and
    transmitting the channel input over the network to a decoder that reconstructs the plurality of source samples using the channel input for each of the plurality of subbands.

20. The apparatus of claim 19, wherein the first number of source samples is equal to a number of channel uses.

* * * * *